(12) United States Patent
Matsumoto et al.

(10) Patent No.: US 7,073,834 B2
(45) Date of Patent: Jul. 11, 2006

(54) MULTIPLE SECTION END EFFECTOR ASSEMBLY

(75) Inventors: Takayuki Matsumoto, Santa Clara, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 10/876,439

(22) Filed: Jun. 25, 2004

(65) Prior Publication Data

US 2005/0285419 A1    Dec. 29, 2005

(51) Int. Cl.
*B65G 49/07*    (2006.01)
(52) U.S. Cl. .................. 294/902; 294/1.1; 414/941
(58) Field of Classification Search ............ 294/1.1, 294/902; 414/935, 941, 744.1
See application file for complete search history.

(56) References Cited

U.S. PATENT DOCUMENTS

| | | | | |
|---|---|---|---|---|
| 5,810,935 A | * | 9/1998 | Lee et al. ................ 118/728 |
| 5,984,391 A | * | 11/1999 | Vanderpot et al. .......... 294/1.1 |
| 6,050,739 A | * | 4/2000 | Dunn ...................... 403/260 |
| 6,116,848 A | * | 9/2000 | Thomas et al. ............ 414/754 |
| 6,260,894 B1 | * | 7/2001 | Minnick et al. ........... 294/1.1 |
| 6,267,423 B1 | * | 7/2001 | Marohl et al. ............ 294/1.1 |
| 6,276,731 B1 | * | 8/2001 | Hino ....................... 294/1.1 |
| 6,322,116 B1 | * | 11/2001 | Stevens .................. 294/64.3 |
| 6,435,798 B1 | * | 8/2002 | Satoh ..................... 414/217 |
| 6,474,712 B1 | * | 11/2002 | Govzman et al. .......... 294/106 |
| 6,634,686 B1 | * | 10/2003 | Hosokawa ................ 294/1.1 |
| 2003/0012631 A1 | | 1/2003 | Penois et al. |
| 2004/0113444 A1 | * | 6/2004 | Blonigan et al. .......... 294/1.1 |

\* cited by examiner

*Primary Examiner*—Eileen D. Lillis
*Assistant Examiner*—Esther Onyinyechi Okezie
(74) *Attorney, Agent, or Firm*—Patterson & Sheridan, LLP

(57) ABSTRACT

Embodiments of an end effector assembly for a substrate robot are provided herein. In one embodiment, the end effector assembly includes a wrist and a first and a second end effector coupled to the wrist in a spaced apart relationship. The first end effector includes a base coupled to the wrist and a tip coupled to the base opposite the wrist. The base and the tip may be made of the same or different materials. The first and the second end effectors may have different resonant frequencies to minimize vibration. Optionally, a low emissivity coating may be provided on the first and second end effector. The low emissivity coating may further have a plurality of stress relief grooves to reduce or prevent flaking of the coating due to differences in rates of thermal expansion between the coating and the underlying end effector.

33 Claims, 5 Drawing Sheets

MULTIPLE SECTION END EFFECTOR ASSEMBLY

BACKGROUND OF THE INVENTION

1. Field of the Invention

The embodiments of the invention generally relate to an end effector assembly for handling large area substrates in a processing system.

2. Background

Flat panel displays—such as active matrix, or thin film transistor (TFT) displays, liquid crystal displays (LCD), plasma displays, and the like—are commonly used in such applications as computer and television monitors, cell phone displays, personal digital assistants (PDAs), and an increasing number of other devices. Generally, flat panel displays comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production, and lower manufacturing costs have driven equipment manufacturers to develop new systems that accommodate larger size glass substrates for flat panel display fabricators. Current glass processing equipment is generally configured to accommodate substrates up to about one square meter. Processing equipment configured to accommodate even larger substrate sizes is envisioned in the immediate future.

Glass substrate processing is typically performed by subjecting a substrate to a plurality of sequential processes to create devices, conductors, and insulators on the substrate. Each of these processes is generally performed in a process chamber configured to perform one or more steps of the production process. In order to efficiently complete the entire sequence of processing steps, a number of process chambers are typically coupled to a central transfer chamber that houses a robot to facilitate transfer of the substrate between the process chambers. Processing platforms having this configuration are generally known as cluster tools. Such cluster tools for glass substrate processing are available from AKT, Inc., a wholly-owned subsidiary of Applied Materials, Inc., of Santa Clara, Calif.

As glass substrates increase in size, the manufacturing equipment for handling and processing these substrates must become larger as well. The increased size of substrate handling equipment, such as the transfer robot mentioned above, has created a number of technical challenges that must be overcome in order to maintain accurate substrate transfer. For example, one transfer robot used to handle flat panel substrates has a series of cantilevered end effectors supported from a wrist that support that underside of the substrate. However, the long end effectors required to adequately support large area substrates are subject to "droop", or sag. The sag of the end effector must be accommodated by greater range of robotic motion and/or greater component clearance, both of which undesirably lead to higher tool costs.

The end effector may be made of a single piece of ceramic to minimize droop due to the high Young's modulus of ceramic materials. However, as ceramic shrinks by 20–30 percent upon baking, furnaces need to be at least 20–30 percent larger than the final product. Furnaces of such capacity are not readily available for end effector production. Therefore, it is difficult to make large one-piece end effectors to accommodate larger substrates due to furnace size limitations and high costs associated with their manufacture.

Therefore, there is a need for an end effector to accommodate large substrates.

SUMMARY OF THE INVENTION

Embodiments of an end effector assembly for a transfer robot are provided herein. In one embodiment, the end effector assembly includes a wrist and a first and a second end effector coupled to the wrist in a spaced apart relationship. The first end effector includes a base coupled to the wrist and a tip coupled to the base opposite the wrist. The base and the tip may be made of the same or different materials. The first and the second end effectors may have different resonant frequencies to minimize vibration.

Optionally, a low emissivity coating may be provided on the first and second end effector. The low emissivity coating may further have a plurality of stress relief grooves to reduce or prevent flaking of the coating due to differences in rates of thermal expansion between the coating and the underlying end effector.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

DETAILED DESCRIPTION

Figure 1:
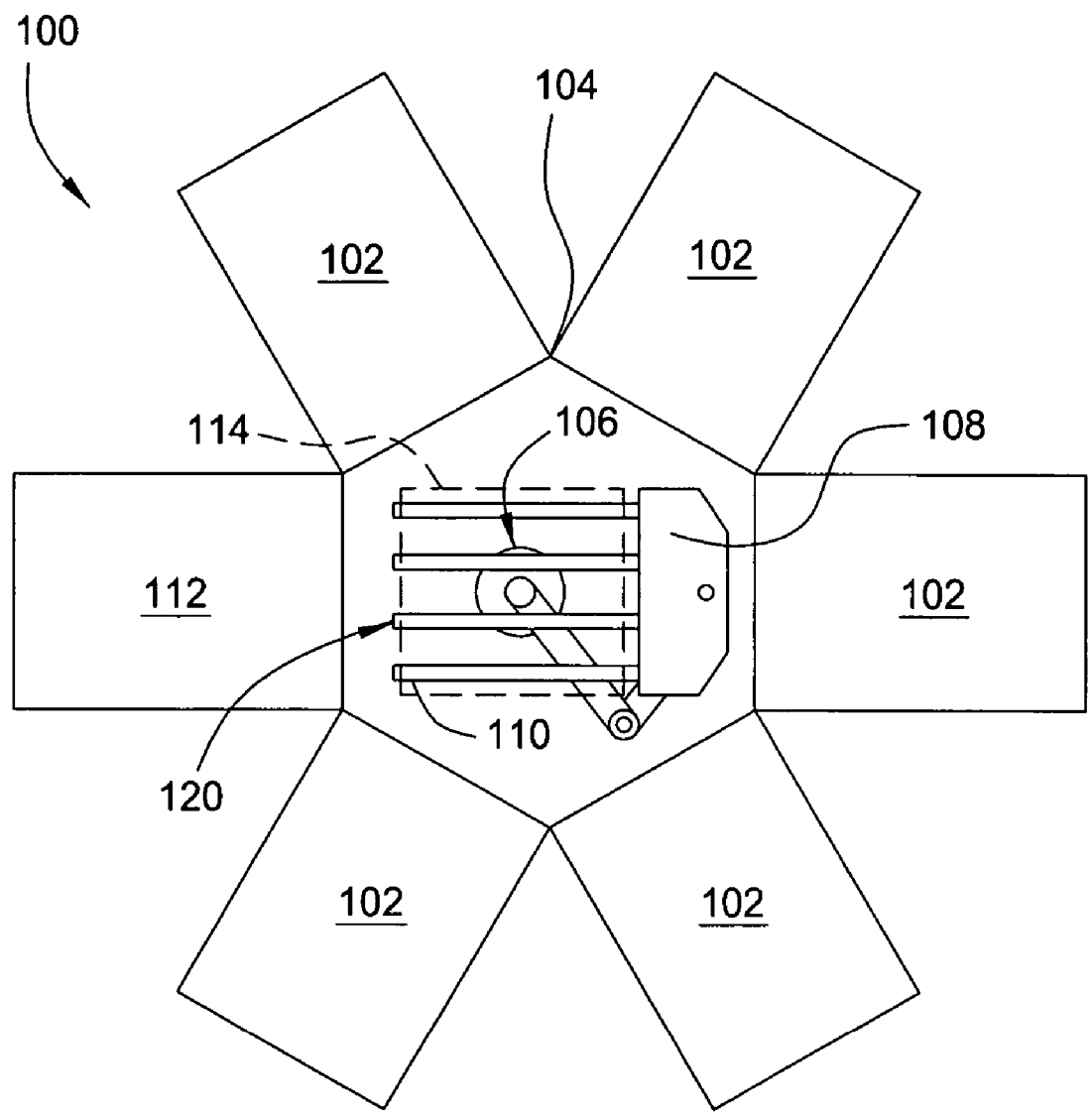
FIG. 1 depicts a simplified schematic diagram of a cluster tool.

FIG. 1 depicts a simplified schematic diagram of a cluster tool 100 having at least one robot equipped with an end effector assembly of the invention. The cluster tool 100 generally includes a transfer chamber 104, a plurality of process chambers 102, and at least one load lock chamber 112. Process chambers 102 are generally configured to perform one or more steps of the production process. For example, process chamber 102 may be a CVD chamber, an etch chamber, or any other process chamber as is conventionally known in the art. The central transfer chamber 104 generally includes a transfer robot 106 adapted to transfer a substrate 114 (shown in phantom) in and out of the load lock chamber 112 and the various process chambers 102. The substrate transfer robot 106 generally has an end effector assembly 120 that includes a plurality of end effectors 110 extending from a wrist 108. The end effectors 110 are adapted to support the substrate 114 thereon during transfer by the robot 106.

Although the transfer robot 106 having end effectors 110 is suitable for use with conventional substrates, the transfer robot described herein is particularly useful for large area substrates, i.e., substrates having an area up to and exceeding four square meters. Furthermore, although the end effector assembly 120 is shown coupled to the transfer robot 106 disposed in the transfer chamber 104, the transfer robot 106 may be disposed In a process chamber, such as an electron beam test (EBT) chamber. One exemplary EBT chamber is described in U.S. Pat. No. 6,833,717, which issued Dec. 21, 2004, entitled "Electron Beam Test System with Integrated Substrate Tranfer Module." In addition, the end effector may be utilized in other robotic applications, including those in non-vacuum environments where efficient transfer of large area substrates is desired.

Figure 2:
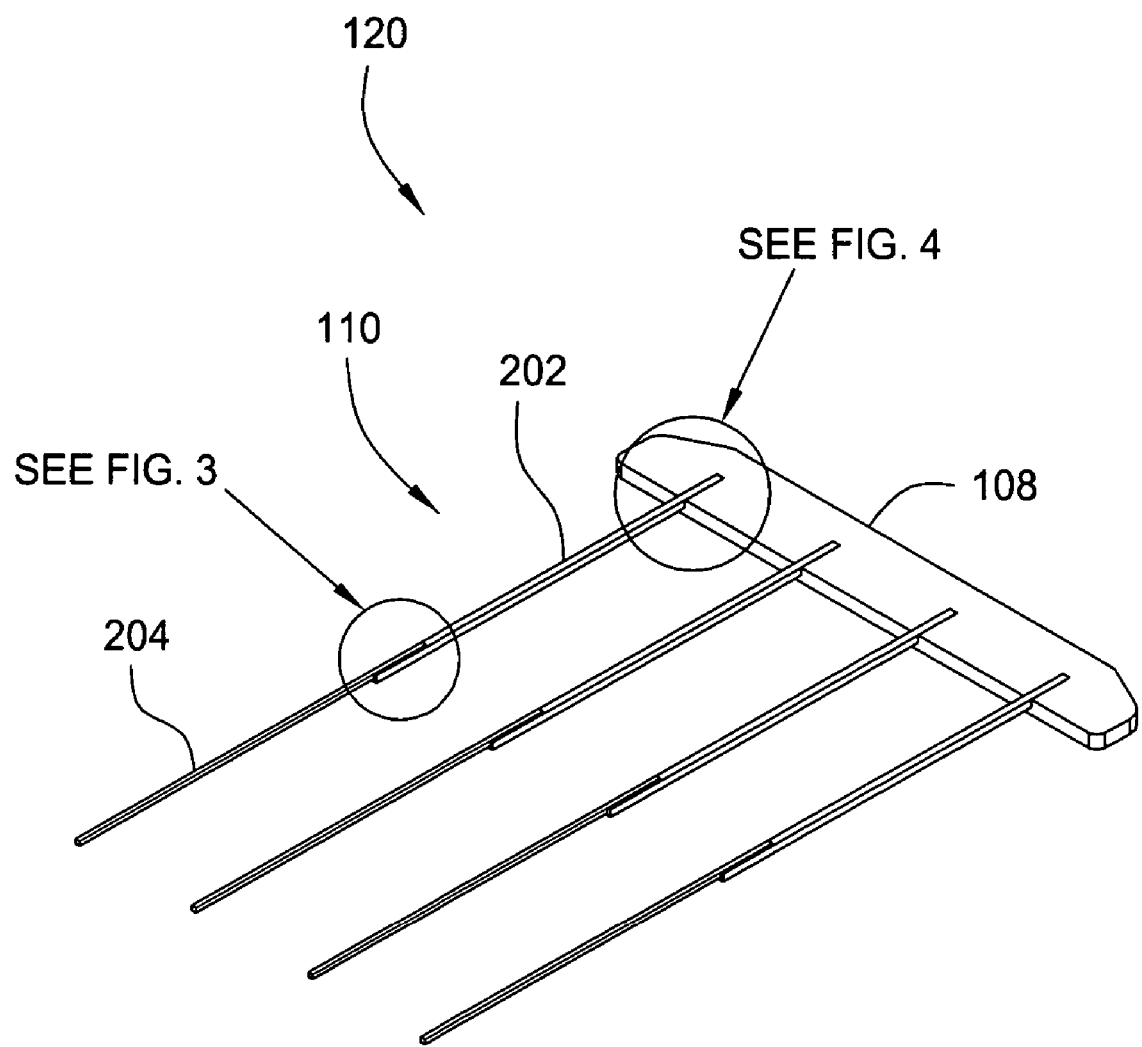
FIG. 2 depicts one embodiment of an end effector and wrist assembly of a transfer robot suitable for use in a transfer chamber of a cluster tool of FIG. 1.

FIG. 2 depicts one embodiment of an end effector assembly 120. In the embodiment depicted in FIG. 2, a plurality of end effectors 110 are held in substantially parallel alignment by the wrist 108 such that a substrate may be supported by the end effectors 110. Although four end effectors 110 are shown coupled to the wrist 108 in FIG. 2, it is contemplated that other quantities of end effectors 110, e.g., at least two, may also be effectively utilized.

The end effector 110 includes a base 202 coupled to a tip 204. The wrist 108 and other components of the transfer robot 106 are generally fabricated from materials selected to minimize thermal effects during substrate transfer. Examples of materials that are suitable for fabrication of the wrist 108 include, but are not limited to, aluminum/silicon carbide composites, glass ceramics (such as Neoceram N-0 and Neoceram N-11, among others), aluminum/iron composites, carbon, carbon matrix composites, cast aluminum alloy, commercially pure chromium, graphite, molybdenum, titanium alloy, molybdenum tungsten alloy, commercially pure molybdenum, Zerodur®, Invar®, titanium Ti-6Al-4V alloy, 8090 aluminum MMC, and metal matrix composites. Metal matrix composites generally include aluminum or other light metal (i.e., magnesium, titanium, aluminum, magnesium alloys, titanium alloys and aluminum alloys) with up to 30 percent fillers, such as silicon carbide and the like.

The base 202 and the tip 204 of the end effector 110 are generally fabricated from materials having high temperature durability. Density of the materials is also an important factor since the end effector may droop, or sag, due to its own weight. This effect may be exacerbated in high temperature applications. Table 1, below, shows a non-inclusive variety of materials that can be used to fabricate the end effector 110. For each material, the table provides the corresponding density in g/cm$^3$ and the Young's modulus in giga-Pascals (GPa). In addition, the final column of Table 1 shows the Young's modulus divided by the density—a relative parameter showing rigidity per density. The higher this calculated value is, the less droop or sag the end effector 110 will incur. Conversely, the lower this value is, the greater the sag of the end effector 110. Material selection for the fabrication of the base 202 and the tip 204 of the end effector 110 may be made by selecting a material or combination of materials that minimize the droop of the end effector 110 or that provide an allowable amount of droop, based upon the tolerances of the system design.

TABLE 1

| Material | Density (g/cm3) | Young's Modulus (Gpa) | Young's Modulus/ Density |
|---|---|---|---|
| Ceramics (Alumina) | 3.8 | 370 | 97 |
| MMC (Metal Matrix Composite) | | | |
| Base Mat: Si, Reinforced Mat: SiC | 2.8 | 270 | 96 |
| Base Mat: Al, Reinforced Mat: Al2O3 | 3.4 | 210 | 62 |
| Al Be matrix (AlBeMet 162) | 2.1 | 193 | 92 |
| CFRP (Carbon Fiber) | 1.7 | 300 | 176 |
| Aluminum (6061) | 2.7 | 69 | 26 |
| SST (304L) | 8 | 200 | 25 |

As can be seen from Table 1, carbon fiber reinforced polymer (CFRP) has the highest rigidity per density followed by alumina, metal matrix composite (MMC) having a silicon base reinforced with silicon carbide, then an aluminum beryllium matrix comprising approximately 38 percent Al and approximately 62 percent Be. One example of such an Al-Be alloy is AlBeMet® 162, available from Brush Wellman, Inc., located in Cleveland, Ohio. AlBeMet® is a registered trademark of Brush Wellman, Inc.

In one embodiment, the base 202 and the tip 204 of the end effector 110 may be made of ceramic due to its small droop (high Young's modulus) and high temperature durability. Examples of suitable ceramics include, but are not limited to, alumina, silicon carbide (SiC), silicon nitride (SiN), and the like. The base 202 and the tip 204 of the end effector 110 are generally designed so that each piece of the end effector 110 can be made within existing furnaces. It is contemplated that the end effector 110 may alternatively be made in one piece if suitably sized furnaces are used.

Alternatively, different materials may be used for the base 202 and the tip 204 of the two-piece end effector 110. For example, in one embodiment, the base 202 of the end effector 110 may be made of a metal or CFRP. The use of metal or CFRP allows the base 202 to withstand larger stresses while, due to its smaller size, not adding significant momentum to the movement to the end effector 110. In one embodiment, the tip 204 of the end effector 110 may be made of ceramic. This minimizes droop or sag while advantageously utilizing the higher temperature durability of ceramic vis-á-vis other materials. In addition to the materials listed in Table 1, above, either or both of the base 202 and the tip 204 of the end effector 110 may be made of any of the materials listed above as suitable for the wrist 108. It is contemplated that other materials and/or combinations of materials may be equally used for this application in accordance with the teachings disclosed herein.

It is further contemplated that each end effector 110 coupled to the wrist 108 of the transfer robot 106 may be made of different materials and/or different combinations of materials than the other end effectors 110 of the transfer robot 106. For example, the composition of two or more end effectors 110 may be selected to differentiate the resonant frequencies of the respective end effectors 110 in the transfer robot 106 and thereby minimize vibration of the transfer robot 106 and/or end effectors 110.

Figure 3:
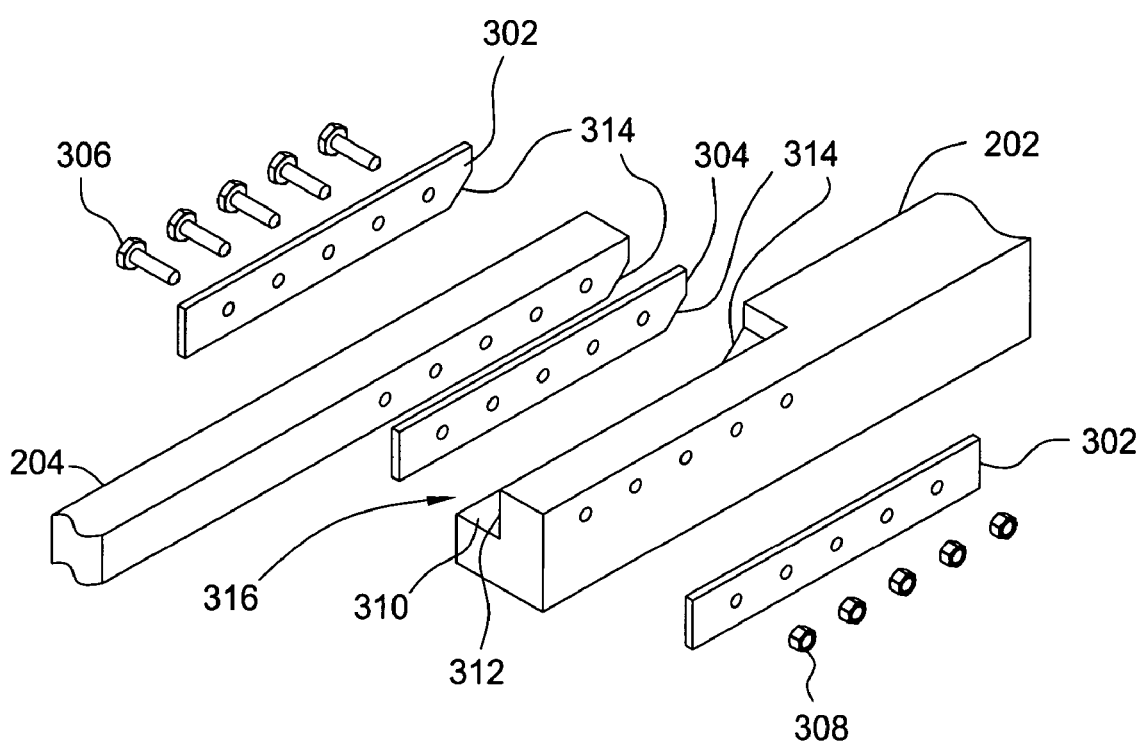
FIG. 3 depicts one embodiment of a joint in a multi-piece end effector.

FIG. 3 depicts one embodiment of a method for fastening the base 202 to the tip 204 of the end effector. A rabbet 316 is formed in the base 202 leaving a ledge 310 and a sidewall 312, such that the tip 204 is disposed on the ledge 310 and alongside the sidewall 312. A pad 304 may optionally be placed between the tip 204 and the sidewall 312 to minimize abrasion between the base 202 and the tip 204 of the end effector 110 due to differences in thermal expansion, vibration, handling during assembly and disassembly, and the like. Optionally, a pad (not shown) may be disposed between the tip 204 and the ledge 310 to further minimize abrasion between the base 202 and the tip 204. The pad 304 (and the optional pad not shown) may be made of rubber, aluminum film, or other suitable material. The pad 304 additionally reduces vibrations transferred to the tip 204 of the end effector 110 from the base 202. An edge relief, such as a chamfer 314, may be provided to minimize damage during assembly. Other forms of edge relief other than the chamfer 314 may also be utilized, such as a radius or other shape. The tip 204 is secured to the base 202 by a plurality of fasteners. In the embodiment depicted in FIG. 3, five bolts 306 pass through a plurality of holes provided in the tip 204 and the base 202 and are held secure by five nuts 308. A pair of plates 302 is provided on either side of the end effector 110 to evenly distribute the load applied by the fasteners across the surface of the base 202 and the tip 204 of the end effector 110. Plates 302 may be made of stainless steel, titanium alloy, or other suitable material.

Figure 4:
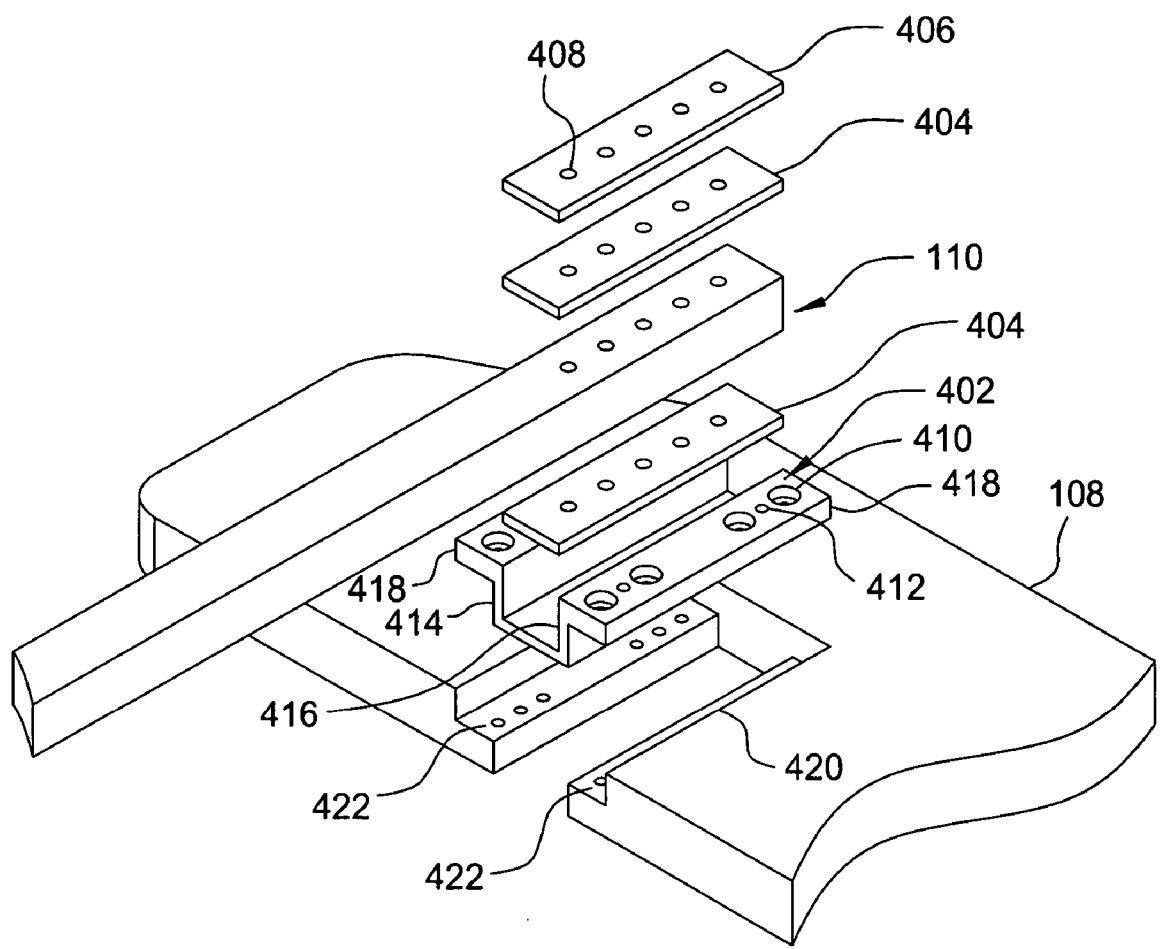
FIG. 4 depicts one embodiment of a bracket for coupling an end effector to the wrist of a transfer robot.

FIG. 4 depicts one embodiment of a bracket assembly for connecting an end effector 110 to the transfer robot wrist 108. In this embodiment, a bracket 402 is used to couple the end effector 110 to the wrist 108. The bracket 402 includes a body 414 with a stepped channel 416 and upper shoulders 418. The end effector 110 rests in the channel 416. A pad 404 may be provided between the end effector and the bracket 402. In the embodiment depicted in FIG. 4, a plurality of holes 408 is provided for securing the end effector 110 to the bracket 402 by a plurality of fasteners (not shown). A load distribution plate 406 is provided to evenly distribute the load applied by the fasteners across the surface of the end effector 110.

A pad 404 may be provided between the load distribution plate 406 and the end effector 110. The pad 404 may be made of rubber, aluminum film, or other thin material that can withstand processing conditions. The pad 404 may also act as a vibration damper to minimize vibration of the end effector 110.

A slot 420 is formed in the wrist 108 for receiving the bracket 402 and includes a ledge 422 formed on either side of the slot 420 for supporting the upper shoulders 418 of the bracket 402. A plurality of holes 410 are formed in the upper shoulders 418 of the bracket 402 to accommodate fasteners (not shown) for fastening the bracket 402 to the ledge 422 of the wrist 108. A second plurality of holes 412 is formed in the upper shoulders 418 of the bracket 402 to accommodate a plurality of set screws (not shown) for controlling or adjusting the alignment between the end effector 110 and the wrist 108.

Figure 5:
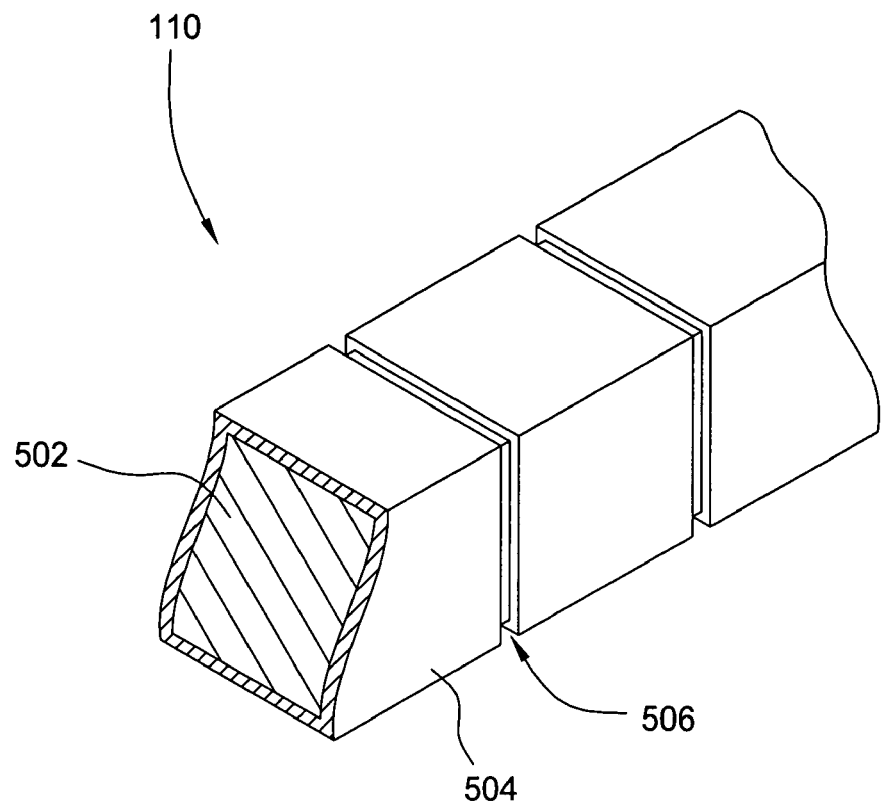
FIG. 5 is a partial isometric view of an end effector having a low emissivity coating.

Optionally, the end-effector 110 may be coated with a material having a low surface emissivity, illustrated in FIG. 5 by a partial sectional view, to aid in reducing the temperature of the end effector 110. In one embodiment, a coating 504 is provided, for example, by sputtering onto the end effector 502. A plurality of grooves 506 are formed in the coating 504. The grooves 506 may extend partially or completely through the coating 504. Each groove 506 generally extends around the perimeter of the end effector 110. The grooves 506 prevent or reduce flaking of the coating 504 due to differences in rates of thermal expansion between the coating 504 and the underlying end effector 502. It is contemplated that the coating 504 and grooves 506 may be disposed on select surfaces of the end effector 110. For example, the coating 504 may be applied solely on a top surface of the end effector 110, or solely on the tip 204 of the end effector 110 (as depicted in FIG. 2), or on any surface of the end effector 110 or portion thereof where temperature reduction is desired.

The coating 504 may be, e.g., sputtered aluminum, or chromium or nickel plating and the like. In general, any material having a low emissivity that can be plated or sputtered can be used for the coating 504. Optionally, the coating 504 may be polished or otherwise processed to further lower the emissivity of the coating 504. Generally, an emissivity in the range of from about 0.04 to about 0.11 is suitably low. The low emissivity of the coating 504 reflects a majority of the energy that the end effector 110 may be exposed to and thus prevents absorption and conversion of such energy into heat.

Figure 6:
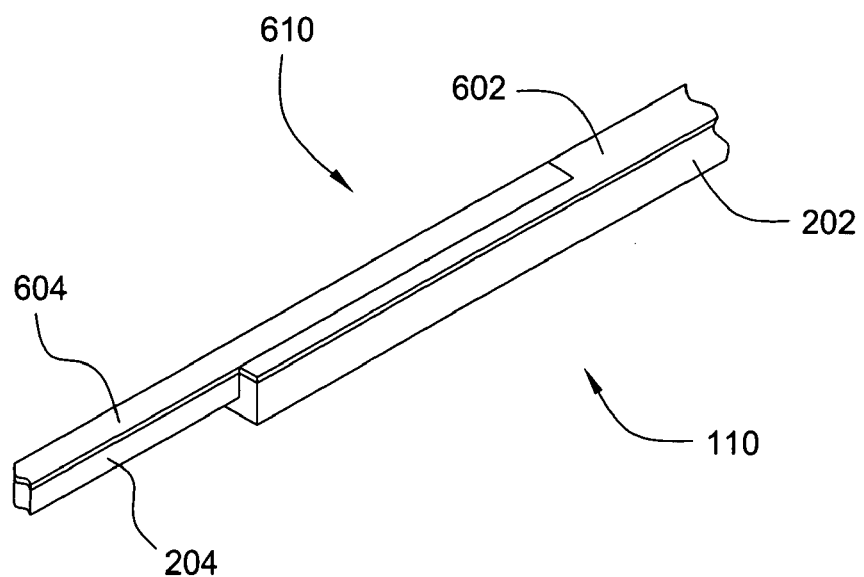
FIG. 6 is a partial isometric view of an end effector having a heat shield.

In another embodiment, illustrated in FIG. 6, the end effector 110 is covered with a heat shield 610. The heat shield 610 may include a base portion 602 and a tip portion 604 that respectively conform to the base 202 and the tip 204 of the end effector 110. Alternatively, the heat shield 610 may be fabricated as a single piece that covers all or a portion of the end effector 110. The heat shield 610 is mechanically fastened to the end effector 610 for example, by screwing, bolting, welding, bonding, gluing, and the like.

The heat shield 610 typically comprises a low emissivity material compatible with process conditions. In one embodiment, the heat shield 610 is an aluminum sheet or foil. Optionally, the heat shield 610 may be polished or otherwise processed to further lower the emissivity of the heat shield 610. Generally, an emissivity in the range of from about 0.04 to about 0.11 is suitably low. Although the heat shield 610 is depicted in FIG. 6 as only covering the upper surfaces of the end effector 110, it is contemplated that the heat shield 610 may be provided on any surface, or multiple surfaces, of the end effector 110 where it is desired to reduce radiant heating of the end effector 110.

Thus, various embodiments of an end effector assembly have been provided. In one embodiment, an end effector assembly includes a plurality of multiple-piece end effectors suitable for handling large area substrates. The end effector may be made of a material or a combination of materials that minimize sag or droop of the end effector. Vibration dampening pads may be provided to the joints coupling the end effectors to the wrist of the transfer robot and to the joints between the base and the tip of the end effector. The end effector may further optionally be coated with a low emissivity material to reduce heating of the end effector. A plurality of stress relief grooves may be provided in the coating to prevent flaking of the coating from the end effector. Thus, a robot having a plurality of end effectors with some or all of the features disclosed above may be utilized to move substrates through a processing system with smaller clearances and a smaller range of motion, thereby lowering the equipment cost.

While the foregoing is directed to the preferred embodiment of the present invention, other and further embodiments of the invention may be devised without departing from the basic scope thereof, and the scope thereof is determined by the claims that follow.

What is claimed is:

1. An end effector assembly for a substrate robot, comprising:
   a wrist;
   a base coupled to a first side of the wrist, the base having a substrate support surface;
   a tip coupled to the base opposite the wrist, the tip having a substrate support surface, wherein the tip and the base define a first end effector; and a second end effector coupled to the first side of the wrist in a spaced apart relationship to the first end effector, wherein the first end effector and the second end effector have different resonant frequencies.

2. The end effector assembly of claim 1, wherein the base and the tip are made of different materials.

3. The end effector assembly of claim 2, wherein the base is made of a metal, metal matrix composite, metal alloy, or CFRP.

4. The end effector assembly of claim 2, wherein the tip is made of ceramic.

5. The end effector assembly of claim 1, wherein the base and the tip are made of the same material.

6. The end effector assembly of claim 5, wherein the base and the tip are made of ceramic.

7. The end effector assembly of claim 1, wherein the first end effector further comprises:
a low emissivity coating formed on the base and the tip.

8. The end effector assembly of claim 7, wherein the coating is one of sputtered or plated onto the base and the tip.

9. The end effector assembly of claim 7, wherein the coating is formed of aluminum, chromium, or nickel.

10. The end effector assembly of claim 7, further comprising:
a plurality of stress relief grooves formed in the coating.

11. The end effector assembly of claim 1, wherein the first end effector further comprises:
a pad sandwiched between the base and the tip.

12. The end effector assembly of claim 11, wherein the pad is made of rubber or aluminum film.

13. An end effector assembly for a substrate robot, comprising:
a wrist;
a base coupled to a first side of the wrist;
a tip coupled to the base opposite the wrist, wherein the tip and the base define a first end effector;
a bracket disposed between the wrist and the base;
a pad disposed between the bracket and the base; and
a second end effector coupled to the first side of the wrist in a spaced apart relationship to the first end effector.

14. The end effector assembly of claim 13, wherein the pad is made of metal or rubber.

15. The end effector assembly of claim 13, having a plurality of holes, each hole configured to receive a set screw for adjusting the alignment of the first end effector with respect to the wrist.

16. An end effector assembly for a substrate robot, comprising:
a wrist;
a base coupled to a first side of the wrist;
a tip coupled to the base opposite the wrist, wherein the tip and the base define a first end effector;
a bracket disposed between the wrist and the base; wherein the bracket further comprises:
a body having a channel adapted to receive the base; and
a pair of shoulders formed on an upper portion of the body; and
a second end effector coupled to the first side of the wrist in a spaced apart relationship to the first end effector.

17. The end effector assembly of claim 16, wherein the bracket fits into a slot formed in the wrist, the shoulders of the bracket resting upon a mating pair of flanges formed in the slot.

18. The end effector assembly of claim 17, having a plurality of holes formed through the shoulders adapted to receive a plurality of set screws that are capable of adjustably extending below the shoulders to engage an upper surface of the flange and thereby controllably adjust the alignment of the first end effector with respect to the wrist.

19. The end effector assembly of claim 17, further comprising:
a pad disposed in the channel and sandwiched between the bracket and the base.

20. The end effector assembly of claim 19, wherein the pad is made of rubber or metal.

21. An end effector assembly for a substrate robot, comprising:
a wrist;
a first end effector having a base portion coupled to a first side of the wrist, the first end effector having a length greater than a length of the base;
a low emissivity coating formed on the first end effector;
a plurality of stress relief grooves formed in the coating; and
a second end effector coupled to the first side of the wrist in a spaced apart relationship to the first end effector, wherein the first end effector and the second end effector have different resonant frequencies.

22. The end effector assembly of claim 21, wherein the coating is one of sputtered or plated onto the first end effector.

23. The end effector assembly of claim 21, wherein the coating is formed of aluminum, chrome, or nickel.

24. An end effector assembly for a substrate robot, comprising:
a wrists;
a first end effector coupled to a first side of the wrist;
a low emissivity coating formed on the first end effector;
a plurality of stress relief grooves formed in the coating; and
a second end effector coupled to the first side of the wrist in a spaced apart relationship to the first end effector, wherein the first end effector is coupled to the wrist by a bracket, the bracket comprising:
a body having a channel adapted to receive the first end effector; and
a pair of shoulders formed on an upper portion of the body.

25. The end effector assembly of claim 24, wherein the bracket fits into a slot formed in the wrist, the shoulders of the bracket resting upon a mating pair of flanges formed in the slot.

26. The end effector assembly of claim 25, having a plurality of holes formed through the shoulders adapted to receive a plurality of set screws that are capable of adjustably extending below the shoulders to engage an upper surface of the flange and thereby controllably adjust the alignment of the first end effector with respect to the wrist.

27. The end effector assembly of claim 24, further comprising:
a pad disposed in the channel and sandwiched between the bracket and the base.

28. The end effector assembly of claim 27, wherein the pad is made of rubber or metal.

29. The end effector assembly of claim 24, wherein the first end effector further comprises:
a base coupled to the first side of the wrist; and
a tip coupled to the base opposite the wrist.

30. A method of transferring a substrate, comprising:
supporting a substrate on an end effector assembly, the assembly comprising:

a wrist;

a base coupled to a first side of the wrist;

a tip coupled to the base opposite the wrist, the tip and the base defining a first end effector; and a second end effector coupled to the first side of the wrist in a spaced apart relationship to the first end effector, wherein the first and second end effector define a substrate receiving surface; and transferring the substrate from the substrate receiving surface to a substrate support, wherein the first end effector and the second end effector have different resonance frequencies .

31. The method of claim 30, wherein the end effector assembly is part of a substrate transfer robot disposed in a transfer chamber.

32. A method of fabricating an end effector assembly, comprising:

providing a wrist having a first side;

coupling a base to the first side of the wrist;

coupling a tip to the base opposite the wrist, the tip and the base defining a first end effector having a first resonant frequency; and coupling a second end effector to the first side of the wrist in a spaced apart relationship to the first end effector, the second end effector having a second resonant frequency different from the first resonant frequency.

33. The method of claim 32, further comprising:

inserting a vibration dampening pad between the base and the tip.

* * * * *

UNITED STATES PATENT AND TRADEMARK OFFICE
CERTIFICATE OF CORRECTION

PATENT NO. : 7,073,834 B2
APPLICATION NO. : 10/876439
DATED : July 11, 2006
INVENTOR(S) : Takayuki Matsumoto and Akihiro Hosokawa It is certified that error appears in the above-identified patent and that said Letters Patent is hereby corrected as shown below:

Column 1, Line 22: Change "pattem" to --pattern--

Column 3, Line 12: Change "In" to --in--

Signed and Sealed this

Twenty-third Day of January, 2007

JON W. DUDAS
*Director of the United States Patent and Trademark Office*